US006961604B1

(12) United States Patent
Vahasalo et al.

(10) Patent No.: US 6,961,604 B1
(45) Date of Patent: Nov. 1, 2005

(54) WIRELESS CONTROLLER AND APPLICATION INTERFACE FOR AN MRI SYSTEM

(75) Inventors: Seppo T. Vahasalo, Kirkkonummi (FI); Gösta J. Ehnholm, Helsinki (FI)

(73) Assignee: Koninklijke Philips Electroncis N.V., Eindhoven (NL)

( * ) Notice: Subject to any disclaimer, the term of this patent is extended or adjusted under 35 U.S.C. 154(b) by 377 days.

(21) Appl. No.: 09/973,205

(22) Filed: Oct. 9, 2001

(51) Int. Cl.[7] .............................................. A61B 5/055
(52) U.S. Cl. ........................ 600/410; 324/318; 600/422
(58) Field of Search ................................ 600/407, 300, 600/410, 437, 422; 128/903; 324/318, 322

(56) References Cited

U.S. PATENT DOCUMENTS

| | | | |
|---|---|---|---|
| 5,245,288 A | 9/1993 | Leussler | 324/322 |
| 5,384,536 A | 1/1995 | Murakami et al. | 324/309 |
| 5,666,055 A | 9/1997 | Jones et al. | 324/318 |
| 5,840,020 A * | 11/1998 | Heinonen et al. | 600/309 |
| 6,198,285 B1 | 3/2001 | Kormos et al. | 324/318 |
| 6,475,146 B1 * | 11/2002 | Frelburger et al. | 600/437 |
| 6,610,012 B2 * | 8/2003 | Mault | 600/437 |
| 6,704,592 B1 * | 3/2004 | Reynolds et al. | 600/411 |
| 6,791,322 B2 * | 9/2004 | Vester | 324/309 |
| 2001/0035752 A1 * | 11/2001 | Kormos et al. | 324/30 |
| 2003/0050555 A1 * | 3/2003 | Critchlow et al. | 600/420 |
| 2003/0206019 A1 * | 11/2003 | Boskamp | 324/322 |

FOREIGN PATENT DOCUMENTS

| | | | | |
|---|---|---|---|---|
| DE | 4440619 | 8/1995 | | |
| WO | WO 03/032002 A1 * | 4/2003 | | G01R 33/28 |

OTHER PUBLICATIONS

Schultz, "Motorola to provide embedded Bluetooth computing solutions" Apr. 2001, Computer Technology Review, 21, 4 pp. 24-25.*
"Motorola: Motorola unveils strategy to provide embedded Bluetooth computing solutions" Apr. 2001, M2 Presswire. Coventry.*

* cited by examiner

Primary Examiner—Shawna J. Shaw
(74) Attorney, Agent, or Firm—Fay, Sharpe, Fagan, Minnich & McKee LLP

(57) ABSTRACT

A wireless remote control unit (60) that operates in the radio frequency bandwidth is used for interfacing with a sequence control system (B) and an image processing system (C) from within a magnetic resonance suite (A) in the presence of a magnetic field produced by a main magnet assembly (10). The sequence control system and the image processing system are connected with a first wireless transceiver (30) whose antenna (28) is located within a magnetic resonance suite. The first transceiver (30) communicates with the remote control unit (60) and a second transceiver (32) connected with a transmitter (40) and gradient coil amplifiers (34). Resonance signals received by a radio frequency coil (46) are communicated to the first transceiver (30) by the second transceiver (32) or by a transceiver (46') mounted on the receiving coil. The receiver coil transceiver also engages in a handshake protocol to identify itself.

10 Claims, 2 Drawing Sheets

WIRELESS CONTROLLER AND APPLICATION INTERFACE FOR AN MRI SYSTEM

BACKGROUND OF THE INVENTION

The present invention relates to the diagnostic imaging arts. It has particular application in conjunction with wireless communication in a magnetic resonance setting and will be described with particular reference thereto. It will be appreciated, however, that the invention is also applicable to other modalities including, but not limited to, CT, SPECT, and PET.

Magnetic resonance (MR) imagers generate high magnetic fields through an imaging region. A typical by-product of the production of this field is a magnetic fringe field that can extend several meters beyond the physical apparatus. Although the excitation fields are high, the induced resonance signals are weak comparable with ambient television and radio signals. In order to minimize disruption to and interference from the surroundings in an environment such as a hospital or clinic, the magnets are often built within specially shielded suites to prevent the fringe field from affecting surrounding objects or people.

As a result, control hardware components for an MR apparatus are placed outside the shielded room. When controlling the apparatus and recalling images, the operator is outside the suite at the control station. This typically leaves the patient unattended during the scan. In many patients, being alone and in such a constricted area such as the bore of an MR device can cause increased anxiety and restlessness, ultimately degrading image quality.

Typically, power and control cables are fed into the MR imaging suite. Cables typically present a problem in that they can introduce radio frequency (RF) disturbances into the imaging volume and receive ambient RF signals. Ultimately, these RF disturbances manifest as imaging artifacts in final images. Typically, these cables are heavily shielded to prevent interference with radio frequency fields produced by the MR device, and vice versa, to prevent the RF fields from corrupting information fed through the cables. As a result of shielding, these cables become quite bulky, and present obstacles within the MR suite. This can restrict access to the MR device from wheelchairs, gurneys, walkers, or other mobility limited patients, as well as lessen mobility of the operator, or other support staff about the device.

A further disadvantage of cables in the MR suite is that detuning of the coils is possible. RF receive coils become less sensitive to the resonance frequency, thereby decreasing the signal to noise ratio. In addition, cables can focus RF power onto small portions of the patient, posing potential health hazards.

The present invention provides a new and improved method and apparatus which overcomes the above-referenced problems and others.

SUMMARY OF THE INVENTION

In accordance with one aspect of the present invention, a magnetic resonance apparatus is provided. A magnet assembly generates a main magnetic field through a subject in an imaging region. A sequence control system generates magnetic resonance sequences. An RF coil receives resonance signals from the imaging region. An image processing system processes the resonance signals into images. A wireless interface provides wireless communication between systems of the magnetic resonance apparatus.

In accordance with another aspect of the present invention, a method of magnetic resonance is provided. A main magnetic field is induced through a subject in an imaging region. Magnetic resonance is excited and manipulated. Requests to a control console are made with radio frequency signals. Resonance signals are received, demodulated, and reconstructed into an image representation of the subject in the imaging region.

In accordance with another aspect of the present invention, an improvement to a magnetic resonance imaging system includes communicating within a magnetic resonance suite with radio frequency communications signals.

One advantage of the present invention resides in improved mobility for patients and operators around an MR device.

Another advantage resides in the ability of the operator to remain close to the patient during the scan.

Another advantage resides in the reduction of cumbersome material within the medical imaging suite.

Another advantage resides in the ability of the operator to control the MR device from locations other than the control console.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
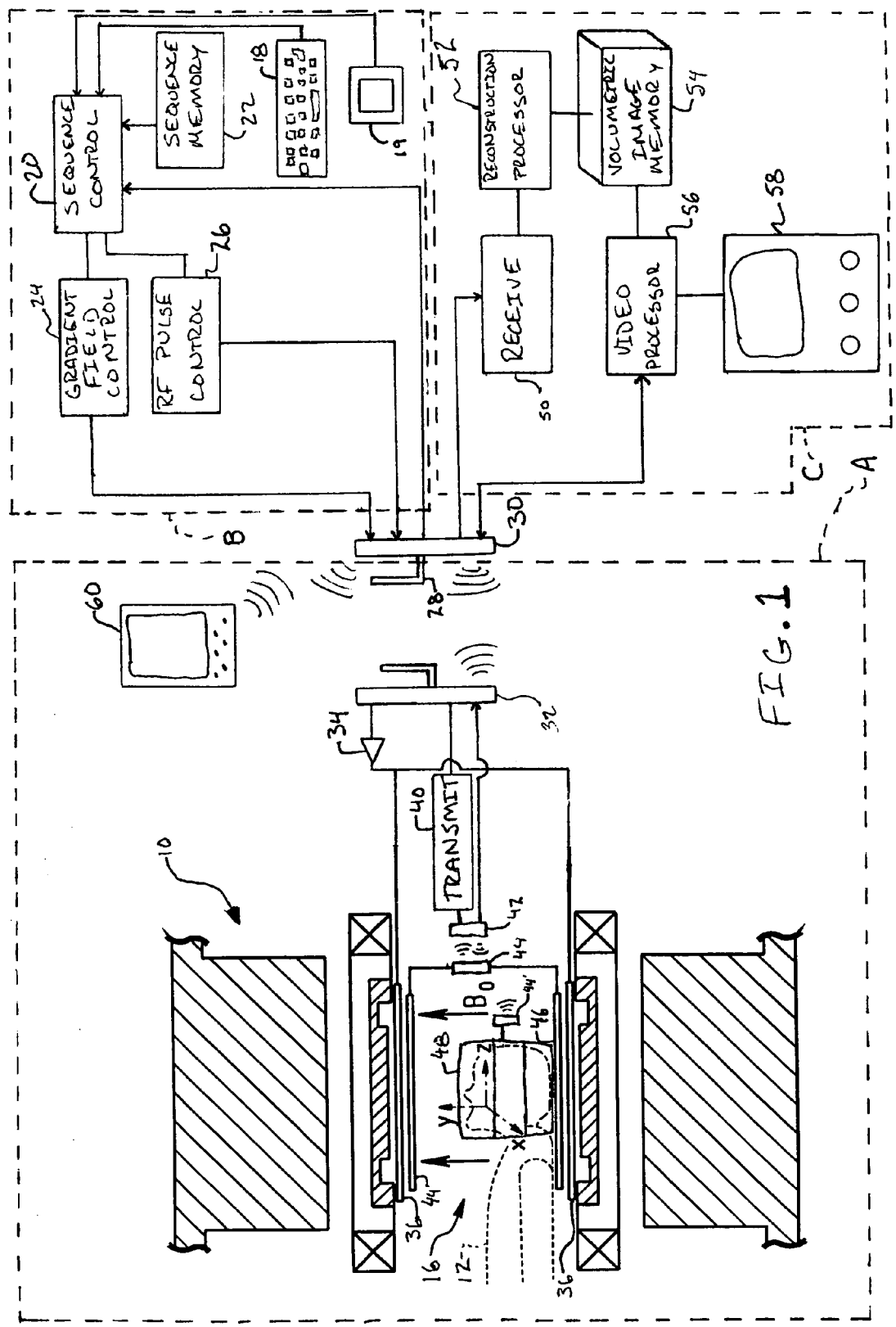
FIG. 1 is a diagrammatic illustration of wireless communication in an MR environment, in accordance with the present invention.

With reference to FIG. 1, an open main magnet assembly 10 which generates a temporally constant main magnetic field, typically denoted $B_o$, vertically through an imaging region 16 is disposed in a magnetic resonance suite A. It should be noted that although depicted in conjunction with an open magnet system, the preferred embodiment of the present invention is equally applicable to bore type systems. A subject 12 is disposed on a patient support located in the imaging region 16 of the magnet assembly 10. The main magnet assembly, 10 is located within a magnetic resonance suite, which is preferably shielded to be impervious to electromagnetic radiation, particularly in the radio frequency band.

A sequence control system B generates magnetic resonance imaging sequences. A keyboard 18 or touch screen 19 receives operator control commands. A sequence control processor 20 withdraws a selected magnetic resonance sequence from a sequence memory 22. A gradient field controller 24 produces gradient waveforms in accordance with the selected sequence. Concurrently, an RF pulse controller 26 generates RF pulse patterns in accordance with the selected sequence.

At least an antennae 28 of a first wireless interface, such as a transceiver 30, is located within the imaging suite A. The wireless interface 30 encodes (preferably digitally) and transmits the gradient waveforms and the RF pulse patterns on a high frequency carrier wave to a second transceiver 32. The second transceiver decodes the gradient pulse waveforms and communicates them to RF shielded gradient amplifiers 34 which are connected with gradient coils 36. The gradient coils 36 impose gradient fields along the main magnetic field $B_o$ thereby spatially encoding the main magnetic field. The second transceiver also decodes the RF pulse pattern information and supplies RF pulse information to an RF shielded transmitter 40. In one embodiment, the transmitter is connected directly with the RF coil. In the illustrated embodiment, the transmitter is connected to a third transceiver 42 which is in radio communication with a fourth transceiver 44 on an RF coil 46. The RF coil 46 includes a coil identification. A handshaking protocol between transceivers 42 and 44 identifies the coil to the rest of the system. In a system with multiple local or other receive coils, each receive coil has an identification so the system can identify each coil with a handshaking protocol. The third and fourth RF transceivers 42, 44 share a similar relationship to the first and second RF transceivers 30, 32 as discussed previously. The RF coil 46 transmits the RF pulses into the imaging region 16, exciting and manipulating magnetic resonance in accordance with the selected sequence. The RF receive coil receives the resultant resonance signals which are transmitted to the wireless interface 30 directly or via the second and third transceivers 32, 42.

Preferably, the scanner includes the whole body RF coil 46 and a plurality of localized coils, such as head coil 48. The RF coils each include a unique identifier and a transceiver 44'. The transceivers 42 and 44, 44' are preprogrammed with a handshake protocol by which the transceiver 42 interrogates the transceiver 44, 44' to and receives an identification of the coil. The coil information is communicated to the sequence control system to verify that the correct coil is installed and to make any sequence adjustments to customize the sequence to the specific RF coil.

In the preferred embodiment, the antenna 28 of first transceiver 30 is mounted to an inside wall of the magnetic resonance suite A. Cables connecting the first transceiver 30 to the antenna 28 are fed through the wall. The second transceiver 32 is preferably mounted adjacent the magnet assembly, with as little cable as possible connecting it to the gradient amplifier 34, the transmitter 42 (in the direct wire embodiment), and other systems of the MR apparatus. Preferably, the first and second transceivers 30, 32 have a line of sight with each other free from any radio-opaque materials in the magnetic resonance suite.

In the preferred embodiment, the first and second transceivers 30, 32 transmit in a higher frequency band than the RF coil 44. In a 1.5 T magnet, hydrogen dipoles (most commonly used for imaging) precess at approximately 64 MHZ; in a 0.75 T magnet, the resonance frequency is approximately 32 MHZ. In order to tip these dipoles into the transverse plane, as is common practice, RF pulses containing frequency components close to this precession frequency are synthesized by the RF pulse controller 26. In the preferred embodiment, the transceivers 30, 32, 42, 44 transmit carrier waves of approximately 2.4 GHz. This ensures that RF signals from the transceivers do not interfere with RF signals used for imaging. Although about 2.4 GHz is the preferred frequency range, any frequency above about 500 MHZ is acceptable. Frequencies below 500 MHZ can begin to interfere with the RF signals used for excitation and manipulation, especially in higher field systems where the dipoles precess with higher frequencies.

Signals from resonating dipoles are detected by the RF coil 46 or dedicated receive coils 48 and preamplified. The detected resonance signals are encoded and transmitted by the patient side transceiver 44 either to the transceiver 42 or directly to the transceiver 30. The first transceiver 30 receives and decodes the resonance signals and sends the resonance signals to an image processing system C. A receiver 50 preferably digital, demodulates the resonance signals. The demodulated resonance signals are reconstructed into an image representation of the subject 12 in the imaging region 16 by a reconstruction processor 52. The images are stored in a volumetric image memory 54, where they remain until needed. A video processor 56 extracts portions needed for viewing, which portions are displayed on a human readable display 58 such as a video monitor, LCD display, active matrix monitor, or the like.

Figure 2:
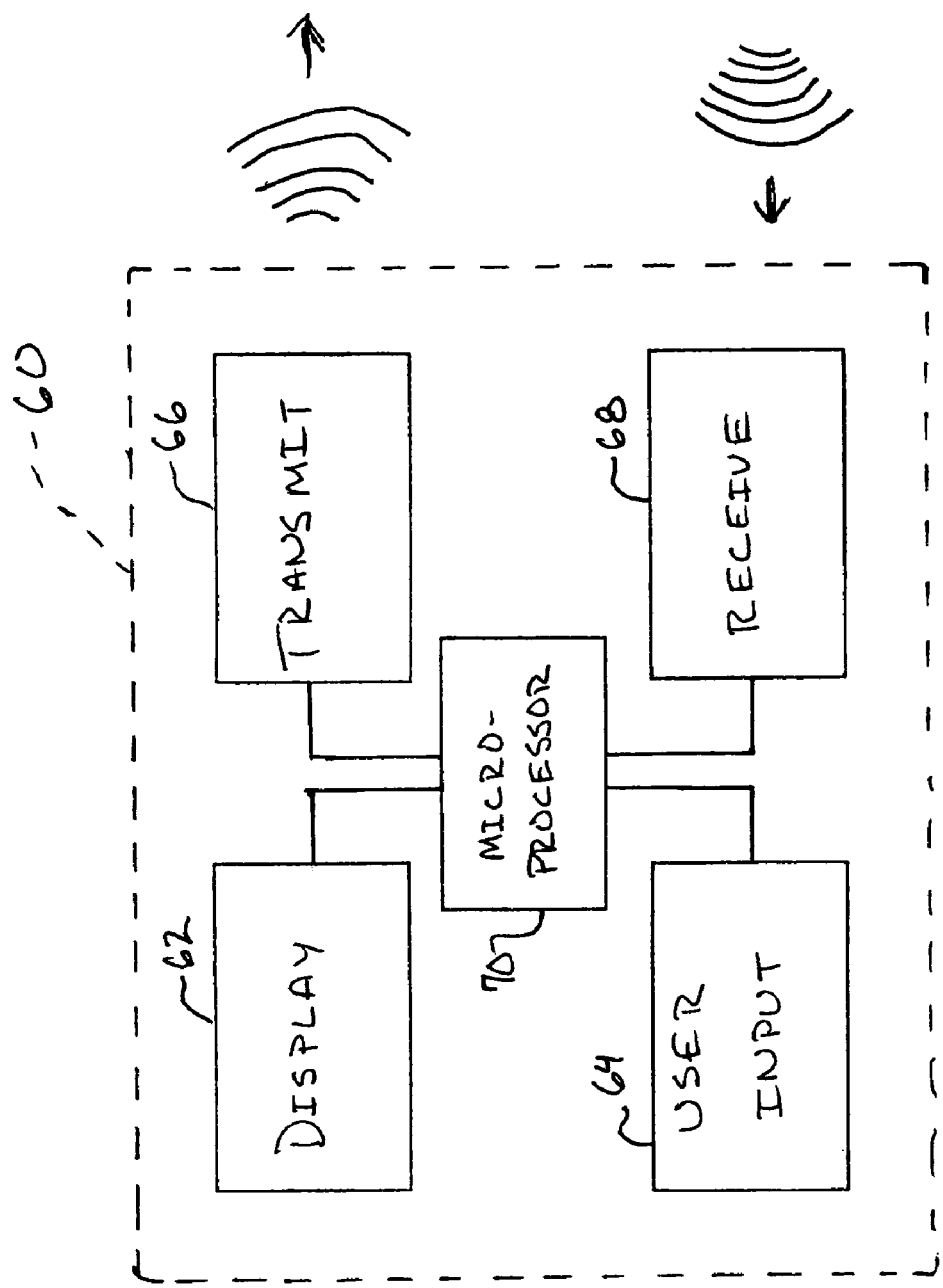
FIG. 2 is a diagrammatic illustration of a hand held remote interface unit, in accordance with the present invention.

With reference to FIG. 2 and continuing reference to FIG. 1, the preferred embodiment of the invention includes a hand-held remote control interface unit 60. The remote control unit 60 allows the operator to communicate with the sequence control system and the image processor system of the MR apparatus. In the preferred embodiment, the remote unit 60 includes a display 62. From the display 62, the operator is able to observe information regarding the current scan. Such information includes, but is not limited to, elapsed scan time, estimated remaining scan time, selected portions of reconstructed images, available options, etc. Such devices as palm pilots, laptop computers, and the like are contemplated as available embodiments. Cellular phone units are also contemplated.

The remote unit also includes a user input portion 64. This portion allows the operator to relay instructions to the sequence control and image processing systems. Instructions contemplated can be as simple as ordering the commencement or abortion of an imaging sequence, and more complex, such as selecting sequences, adjusting RF pulse bandwidth, or changing the size of the k-space data matrix. Instructions can also be sent to the scanner to start or stop a sequence, adjust patient position, select among receive or transmit coils, establish voice communication with the patient, and the like. The input portion 64 may include a touch screen, keyboard, voice recognition, mouse, or any combination thereof. The input portion 64, of course, is not limited to these devices.

The remote unit 60 includes a transmitter 66 and a receiver 68 that facilitate communication. These two portions are connected to an antenna similar to those found in cellular phones. The 2.4 GHz frequency band does not interfere with the RF pulses which excite and manipulate magnetic resonance or the resultant resonance signals. Moreover, when the device is operated within the shielded suite, it does not interfere with cellular communications in the area. An exemplary realization of such a transceiver is embodied in the Bluetooth™ technology by Ericsson mobile phones.

Also included in the remote unit 60 is a microprocessor 70. The microprocessor 70 processes input from the operator and information transmitted by the first transceiver 30 for display on the remote unit 60. Optionally, the microprocessor 70 is included elsewhere, remote from the hand-held unit 60.

The remote unit 60 includes a power source. The power source is selected according to the power consumption needs of the remote unit 60. Typical power sources include batteries (disposable or rechargeable), storage capacitors which are charged by AC power or power from RF pulses, and solar cells.

In another application of the preferred embodiment, the remote unit 60 is also used in conjunction with peripherals not immediately associated with the MR apparatus. Such devices include ECG machines, respirators, and the like. Communication between the remote unit and the peripheral devices allow the operator to see patient blood pressure, heart rate, and other variables on the remote unit 60. Preferably, each peripheral device has at least a transmitter that transmits directly to the remote unit 60. Optionally, if the microprocessor 70 is not located in the hand held unit 60, then the peripheral device transmits to the first transceiver to process the information transmitted before transmission to the remote unit 60.

In an alternate embodiment, the remote unit is used outside of the imaging suite. In this embodiment, The suite would not be shielded against high frequency RF signals in order to let information to pass into the room.

In another alternate embodiment, the remote unit 60 and transceivers 30, 32, 42, 44, 44' transmit in the infrared spectrum, rather than the radio frequency spectrum.

In another alternate embodiment, the remote unit 60 is used in conjunction with a CT or nuclear imaging scanner. In this embodiment, a greater range of radio frequencies are available, as there are no RF imaging pulses with which to interfere.

In another alternate embodiment, the remote interface lacks the input portion 64 and transmitter 66. In this embodiment, the remote unit 60 is a receive only device that displays information as discussed above, but does not accept user input.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

What is claimed is:

1. A magnetic resonance apparatus comprising:
   a magnet assembly for generating a main magnetic field through a subject disposed in an examination region, the magnet being disposed in a magnetic resonance suite;
   a sequence control system for generating magnetic resonance sequences;
   an RF coil which at least receives resonance signals from the examination region, the RF coil being disposed adjacent the examination region;
   an image processing system which processes the resonance signals received by the RF coil into images and manipulates the reconstructed images;
   a wireless interface disposed with an antennae in the magnetic resonance suite for wireless communication between a handheld wireless remote control unit and at least one of the sequence control system and the image processing system;
   the handheld wireless remote control unit including:
      an image display for displaying images and information from at least one of the sequence control system and the image processing system to an operator;
      an RF receiver for receiving RF signals via the wireless interface from at least one of the sequence control system and the image processing system which carry the images and information for display on the image display;
      an input portion for accepting requests from the operator; an RF transmitter for transmitting the operator requests by the wireless interface to at least one of the sequence control system and the image processing system.

2. The magnetic resonance apparatus as set forth in claim 1, wherein the wireless interface and the remote control unit communicate with carrier frequencies greater than 500 MHZ.

3. The magnetic resonance apparatus as set forth in claim 2, wherein the carrier frequencies are between 2.3 and 2.6 GHz.

4. A magnetic resonance apparatus comprising:
   a magnet assembly for generating a main magnetic field through a subject disposed in an examination region, the magnet being disposed in a magnetic resonance suite;
   a sequence control system for generating magnetic resonance sequences;
   an RF coil which at least receives resonance signals from the examination region, the RF coil being disposed adjacent the examination region;
   an image processing system which processes the resonance signals received by the RF coil into images and manipulates the reconstructed images;
   a wireless interface disposed with an antenna in the magnetic resonance suite for wireless communication between (i) at least one of the sequence control systems and the image processing system and (ii) a wireless remote control unit for communicating information to an operator from at least one of the sequence control system and the image processing system, the wireless remote control unit including:
      a radio frequency receiver for receiving radio frequency signals from the wireless interface.

5. The magnetic resonance apparatus as set forth in claim 4, further including:
   a microprocessor for processing operator input to the remote control unit.

6. A magnetic resonance apparatus including:
   a magnet assembly for generating a main magnetic field through a subject disposed in an examination region, the magnet being disposed in a magnetic resonance suite;
   a sequence control system for generating magnetic resonance sequences;
   an RF coil which at least receives resonance signals from the examination region and wirelessly transmits the resonance signals, the RF coil being disposed adjacent the examination region;
   an image processing system disposed outside the magnetic resonance suite which processes the resonance signals into images and manipulates the reconstructed images;
   an RF receiver and transmitter disposed inside the magnetic resonance suite for receiving the resonance signals transmitted from the RF coil and re-transmitting resonance signals from inside the magnetic resonance suite to the image processing system;
   an RF antenna disposed inside the magnetic resonance suite that is connected to the image processing system for relaying the transmitted resonance signals to the image processing system:

radio frequency transceivers for providing a wireless communication pathway from the RF coil to the RF transmitter.

7. A method of magnetic resonance comprising:

generating a main magnetic field through a subject disposed in an examination region in a magnetic resonance suite;

generating magnetic resonance sequences;

receiving resonance signals from the examination region with an RF coil disposed adjacent the examination region;

converting the resonance signals into resonance data and transmitting the resonance data on a carrier signal;

reconstructing image representations for the magnetic resonance signals;

receiving the carrier signal with a wireless interface and communicating the resonance data to an image processing system;

wirelessly communicating between a handheld wireless remote control unit and at least one of a sequence control system and the imaging processing system through the wireless interface;

transmitting reconstructed image representations from the wireless interface and receiving reconstructed image representations with the remote unit;

displaying the received image representations on the hand-held remote unit.

8. A method of using a magnetic resonance imaging system that includes a shielded imaging suite, a magnet which generates a primary magnetic field through an imaging region located in the imaging suite, RF and gradient coils disposed adjacent the imaging region in the imaging suite, a sequence control system disposed out of the imagine suite, an image processing system, disposed out of the imaging suite, and a hand held remote for use in the imaging suite the sequence control signal communicating magnetic resonance sequence instructions to the RF and gradient coils, magnetic resonance signals received by the RF coils being communicated to the image processing system, the method comprising:

wirelessly communicating magnetic resonance sequence selections from the handheld unit to the out-of-suite sequence control system;

wirelessly communicating the magnetic resonance sequence instructions from the out-of-suite sequence control system to the RF and gradient coils;

wirelessly communicating the received magnetic resonance signals from within the magnetic resonance suite to the out-of-suite image processing system over radio frequency communication signals greater than 0.5 GHz; and wirelessly communicating reconstructed images from the image processing system to the hand held remote.

9. In the magnetic resonance imaging method as set forth in claim 8, wherein the radio frequency communicating includes:

communicating control signals from a hand held controller in the imaging suite to at least one of the sequence control system and the image processing system.

10. In the magnetic resonance imaging method as set forth in claim 8, wherein the communications are digitally encoded on the radio frequency communication signals.

* * * * *